(12) United States Patent
Lin et al.

(10) Patent No.: US 8,514,562 B2
(45) Date of Patent: Aug. 20, 2013

(54) MOUNTING APPARATUS FOR DATA STORAGE DEVICE

(75) Inventors: Chieh-Hsiang Lin, New Taipei (TW); Chih-Min Lin, New Taipei (TW); Wen-Chen Wang, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 231 days.

(21) Appl. No.: 13/189,575

(22) Filed: Jul. 25, 2011

(65) Prior Publication Data
US 2012/0147547 A1    Jun. 14, 2012

(30) Foreign Application Priority Data
Dec. 10, 2010  (TW) .............................. 99143156 A

(51) Int. Cl.
*G06F 1/16* (2006.01)
*F16F 15/02* (2006.01)
*H05K 7/14* (2006.01)

(52) U.S. Cl.
USPC .................... 361/679.31; 248/274.1; 248/636

(58) Field of Classification Search
CPC .............. G06F 1/16; F16F 15/02; H05K 7/14
USPC ...................... 361/679.31; 248/274.1, 636
See application file for complete search history.

(56) References Cited

FOREIGN PATENT DOCUMENTS

| JP | 58060973 U | 4/1983 |
| JP | 06051913 U | 7/1994 |
| JP | 2001-332075 A | 11/2001 |
| TW | M249173 U | 11/2004 |
| WO | 2010027354 A1 | 3/2010 |

*Primary Examiner* — Timothy Thompson
*Assistant Examiner* — Charles Pizzuto
(74) *Attorney, Agent, or Firm* — Altis Law Group, Inc.

(57) ABSTRACT

A mounting apparatus includes an enclosure, a bracket for fixing a data storage device, and a resisting member movably attached to an outer surface of the bracket. The enclosure includes a pressing portion. The resisting member includes a resisting portion and a connecting portion formed from one end of the resisting portion. When the bracket is received in the enclosure, the pressing portion resists against the connecting portion to move the resisting portion toward the enclosure to firmly fix the bracket to the enclosure.

16 Claims, 5 Drawing Sheets

MOUNTING APPARATUS FOR DATA STORAGE DEVICE

BACKGROUND

1. Technical Field

The present disclosure relates to mounting apparatuses and, more particularly, to an apparatus for mounting a data storage device.

2. Description of Related Art

An electronic apparatus, such as a computer or a server, usually includes data storage devices, such as hard disk drives, compact disk read-only memory drives, digital video disk drives, and floppy disk drives. These devices are typically added to increase functionality of the electronic apparatus as desired by a user. The installation of a hard disk drive in a computer typically involves using screws to attach the hard disk drive to a bracket, then the bracket is fixed to a chassis of the computer. Usually, there is space between the bracket and the chassis, which is makes it hard to firmly mount the data storage device.

BRIEF DESCRIPTION OF THE DRAWINGS

Many aspects of the present embodiments can be better understood with reference to the following drawing. The components in the drawing are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
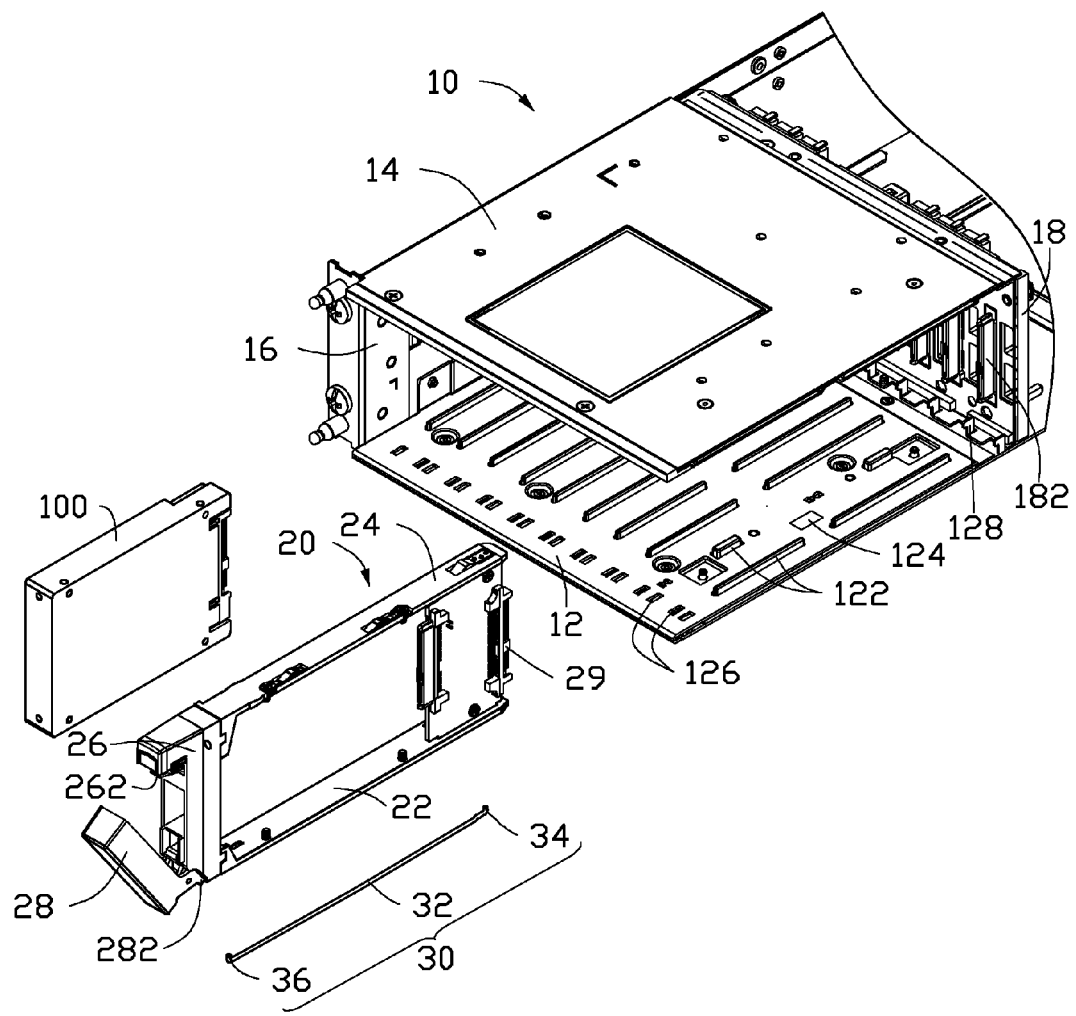
FIG. 1 is an exploded, isometric view of an embodiment of a mounting apparatus and a data storage device.
Figure 2:
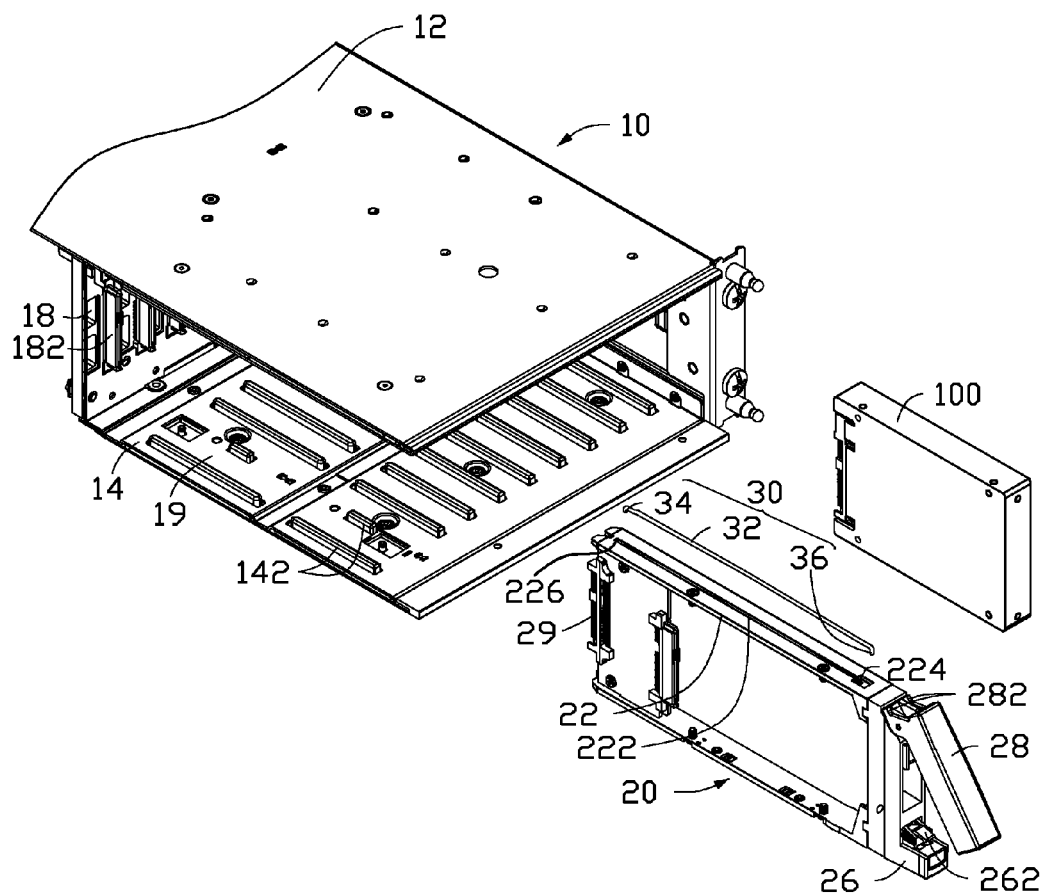
FIG. 2 is an inverted view of FIG. 1.

Referring to FIG. 1 and FIG. 2, an embodiment of a mounting apparatus is provided to mount a data storage device 100, such as a hard disk drive. The mounting apparatus includes an enclosure 10, a bracket 20 receiving the data storage device 100, and a resisting member 30.

The enclosure 10 includes a first sidewall 12 and a second sidewall 14 parallel to the first sidewall 12. An opening 16 is bound by the first ends of the first sidewall 12 and the second sidewall 14. An end wall 18 is substantially perpendicularly connected between one end of the first sidewall 12 and one end of the second sidewall 14. Two parallel flanges 122 protrude on the first sidewall 12, along a direction from the first end to the second end of the first sidewall 12. A shockproof member 124 is arranged on the first sidewall 12 between the flanges 122. The shockproof member 124 is made of rubber. Two parallel flanges 142 protrude on the second sidewall 14 and align with the flanges 122. The first and second sidewalls 12 and 14, the flanges 122 and 142 together define a receiving space 19. The first sidewall 12 defines a locking slot 126 in the first end and forms a pressing portion 128 on the second end. A first connector 182 is arranged on the end wall 18, facing the opening 16.

The bracket 20 includes a first mounting plate 22, a second mounting plate 24 parallel to the first mounting plate 22. A base 26 is connected between the first ends of the first mounting plate 22 and the second mounting plate 24. A handle 28 is pivotably mounted to the base 26. A second connector 29 is arranged between the second end of the first mounting plate 22 and the second mounting plate 24 for electrical connection to the data storage device 100. An elongated channel 222 is defined in an outer surface of the first mounting plate 22 opposite to the second mounting plate 24. A locking hole 224 is defined in the first end of the first mounting plate 22 communicating with the locking channel 222. A through hole 226 is defined in the second end of the first mounting plate 22 communicating with the locking channel 222. A hook 262 is formed on an outer side of the base 26. The handle 28 includes a locking portion 282 protruding on a first end of the handle 28, and defines a locking slot 284 (shown in FIG. 5) in a second end of the handle 28, facing the base 26.

The resisting member 30 is substantially pole shaped and made by a long resilient metal wire. The resisting member 30 includes an elongated resilient resisting portion 32, and a connecting portion 34 and a fixing portion 36 formed from opposite ends of the resisting portion 32.

Figure 3:
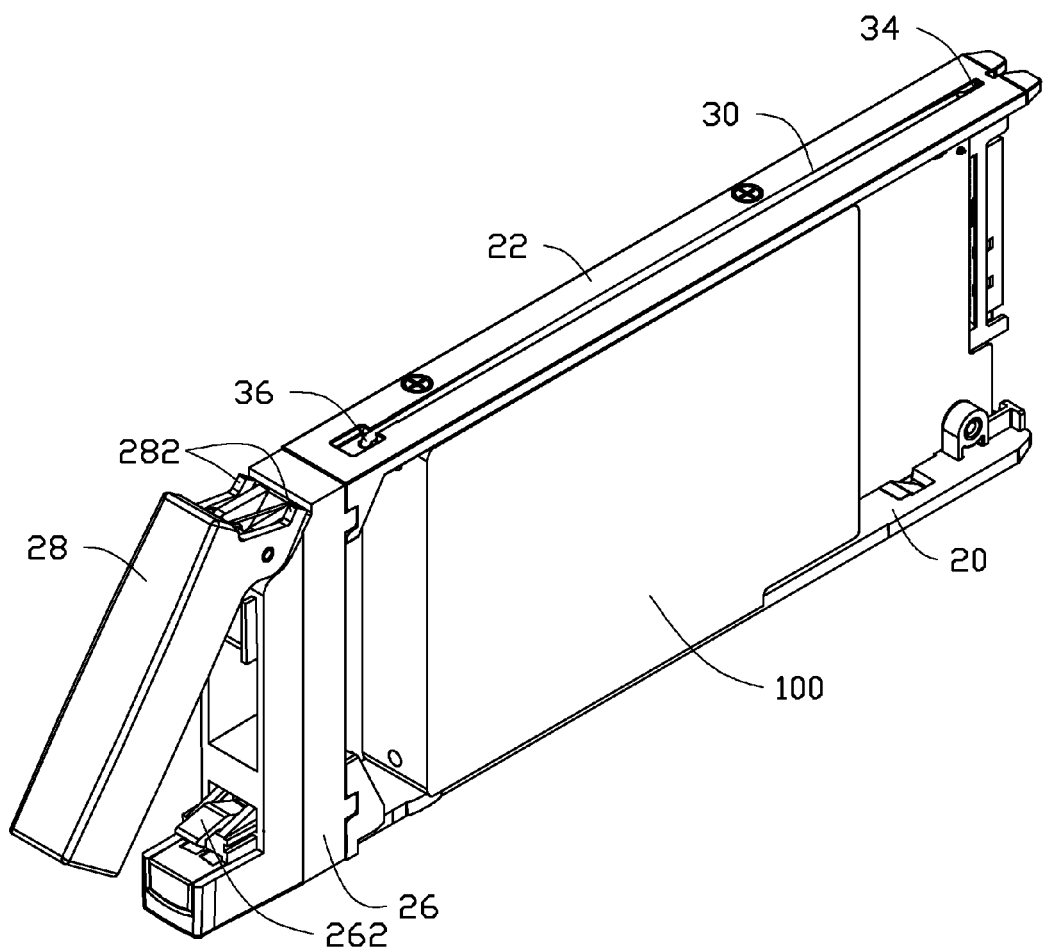
FIG. 3 is a partial assembled view of FIG. 1.
Figure 5:
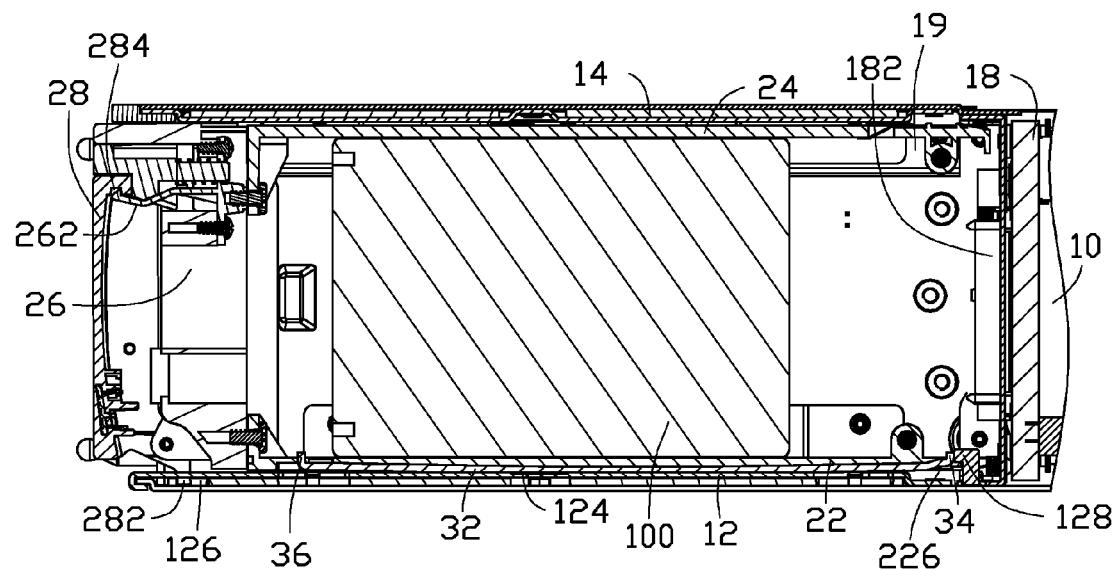
FIG. 5 is a sectional view taken along the line of V-V of FIG. 4.

Referring to FIG. 3, in assembly, the connecting portion 34 extends through the through hole 226 of the first mounting plate 22 and extends out of the inner surface of the first mounting plate 22 (as shown in FIG. 5). The resisting portion 32 is received in the channel 222. The fixing portion 36 is fixed to the locking hole 224 of the first mounting plate 22, to prevent the resisting member 30 from moving along the elongated direction of the first mounting plate 22.

Figure 4:
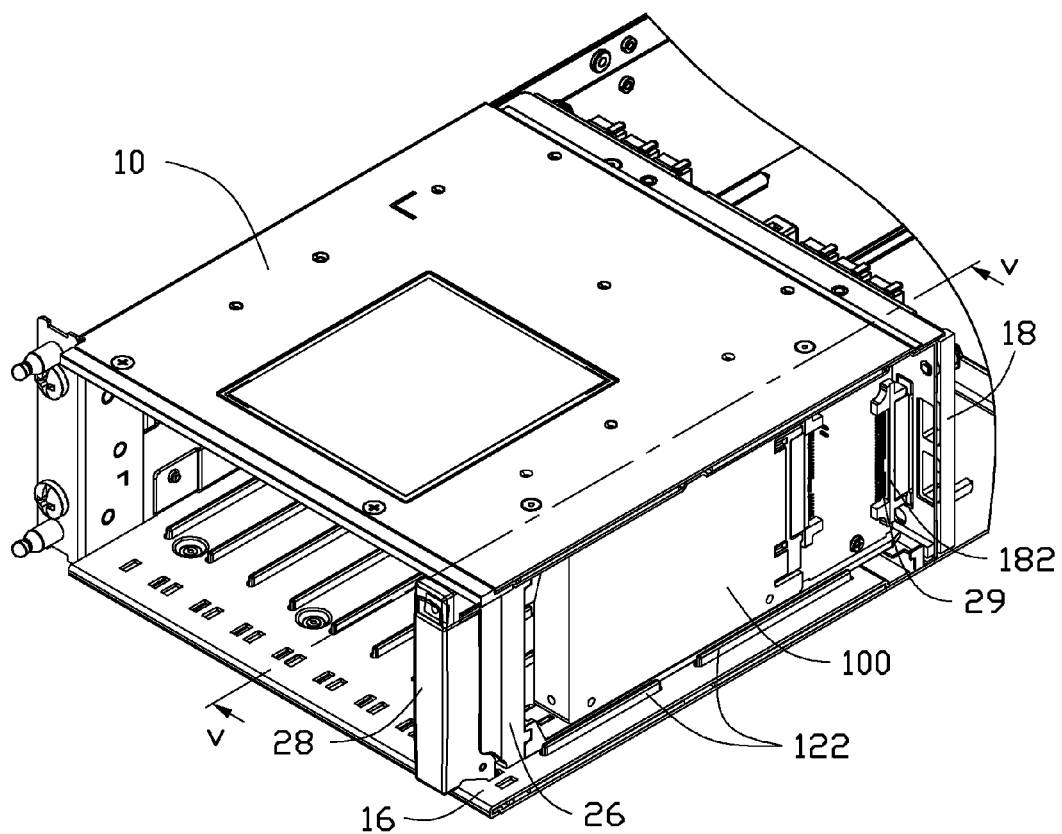
FIG. 4 is an assembled, isometric view of FIG. 1.

Referring to FIG. 4 and FIG. 5, the data storage device 100 is mounted to the bracket 20 between the first mounting plate 22 and the second mounting plate 24. The handle 28 is operated to slidably arrange the bracket 20 in the receiving space 19 through the opening 16, with the second connector 29 aligning with the first connector 182. Then the bracket 20 is pushed to make the second connector 29 to plug into the first connector 182. The handle 28 is rotated toward the base 26 until the locking portion 282 is locked to the locking slot 126. The hook 262 is locked to the locking slot 284 to latch the handle 28 to the base 26. While the bracket 20 is sliding in the receiving space 19, the connecting portion 34 resists against the pressing portion 128 to move the resisting portion 32 toward the first sidewall 12. The resisting portion 32 then resists against the first mounting plate 22 and the shockproof member 124, for firmly mounting the bracket 20 in the enclosure 10.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A mounting apparatus for a data storage device, comprising:

an enclosure comprising a first sidewall and a second sidewall substantially parallel to the first sidewall, wherein the first sidewall defines a first locking slot in a first end of the first sidewall and forms a pressing portion on a second end of the first sidewall;

a bracket comprising a first mounting plate, a second mounting plate substantially parallel to the first mounting plate, a base arranged between the first mounting plate and the second mounting plate, and a handle pivotably connected to the base with a first end, wherein the handle comprises a locking portion protruding from a second end of the handle; and a resisting member mounted to an outer surface of the first mounting plate of the bracket opposite to the second mounting plate, wherein the resisting member comprises a resilient resisting portion and a connecting portion formed from a first end of the resisting portion and extending through the first mounting plate;

wherein when the bracket is received in the enclosure, the handle is rotated toward to the base, the locking portion of the handle is locked to the first locking slot of the enclosure, the pressing portion of the enclosure resists against the connecting portion of the resisting member to move the resisting portion toward the first sidewall of the enclosure until the resisting portion resists against the first sidewall of the enclosure.

2. The mounting apparatus of claim 1, wherein the first mounting plate of the bracket defines a locking hole in a first end of the first mounting plate and a through hole in a second end of the first mounting plate, the resisting member further comprises a fixing portion formed from a second end of the resisting portion, the fixing portion is fixed to the locking hole, the connecting portion of the resisting member extends through the through hole and extends out of an inner surface of the first mounting plate.

3. The mounting apparatus of claim 2, wherein the first mounting plate of the bracket defines a channel in the outer surface for receiving the resisting portion of the resisting member, the locking hole and the through hole of the bracket both communicate with the channel.

4. The mounting apparatus of claim 1, wherein the resisting member is made of an elongated resilient metal wire.

5. The mounting apparatus of claim 1, wherein a shockproof member is set on an inner surface of the first sidewall of the enclosure, the resisting portion resists against the shockproof member.

6. The mounting apparatus of claim 1, wherein the enclosure further comprises an end wall arranged between the first sidewall and the second sidewall of the enclosure, a first connector is set on the end wall, the bracket further comprises a second connector arranged between the first mounting plate and the second mounting plate of the bracket and opposite to the base to be electrically connected to the data storage device, the first connector is connected to the second connector.

7. The mounting apparatus of claim 1, wherein two parallel first flanges protrude on the first sidewall of the enclosure, two parallel second flanges protrude on the second sidewall of the enclosure, the first and second sidewalls, and the first and second flanges together bound a receiving space for receiving the bracket.

8. The mounting apparatus of claim 1, wherein the first sidewall defines a second locking slot, a hook extends from the base to be locked to the second locking slot to latch the handle to the base.

9. An assembly comprising:

an enclosure comprising a first sidewall, a second sidewall substantially parallel to the first sidewall, and an end wall arranged between the first and second sidewalls, wherein the first sidewall defines a first locking slot in a first end of the first sidewall and forms a pressing portion on a second end of the first sidewall, a first connector is set on the end wall;

a bracket comprising a first mounting plate, a second mounting plate substantially parallel to the first mounting plate, a locking portion positioned adjacent to a first end of the first mounting plate, and a second connector arranged between second ends of the first and second mounting plates;

a data storage device fixed in the bracket between the first mounting plate and the second mounting plate of the bracket, wherein the data storage device is connected to the second connector, the second connector is connected to the first connector; and a resisting member mounted to an outer surface of the first mounting plate of the bracket, wherein the resisting member comprises a resilient resisting portion and a connecting portion formed from a first end of the resisting portion;

wherein when the bracket is mounted in the enclosure, the locking portion of the bracket is locked to the locking slot of the enclosure, the pressing portion of the enclosure resists against the connecting portion of the resisting member to move the resisting portion toward the first sidewall of the enclosure until the resisting portion resists against the first sidewall of the enclosure.

10. The assembly of claim 9, wherein the first mounting plate of the bracket defines a locking hole in a first end of the first mounting plate and a through hole in a second end of the first mounting plate, the resisting member further comprises a fixing portion formed from a second end of the resisting portion, the fixing portion is fixed to the locking hole of the bracket, the connecting portion of the resisting member extends through the through hole of the bracket and extends out of an inner surface of the first mounting plate of the bracket.

11. The assembly of claim 10, wherein the first mounting plate of the bracket defines a channel in the outer surface for receiving the resisting portion of the resisting member, the locking hole and the through hole both communicate with the channel.

12. The assembly of claim 9, wherein the resisting member is made of an elongated resilient metal wire.

13. The assembly of claim 9, wherein a shockproof member is set on an inner surface of the first sidewall of the enclosure, the resisting portion resists against the shockproof member.

14. The assembly of claim 9, wherein the bracket further comprises a base arranged between the first mounting plate and the second mounting plate of the bracket, opposite to the second connector, a handle is pivotably connected to the base.

15. The assembly of claim 14, wherein the handle defines a second locking slot, a hook extends from the base to be locked to the second locking slot to latch the handle to the base.

16. The assembly of claim 9, wherein two parallel first flanges protrude on the first sidewall of the enclosure, two parallel second flanges protrude on the second sidewall of the enclosure, the first and second sidewalls, and the first and second flanges of the first and second sidewalls together bound a receiving space for receiving the bracket.

* * * * *